US011327370B2

(12) United States Patent
Fang et al.

(10) Patent No.: US 11,327,370 B2
(45) Date of Patent: May 10, 2022

(54) PEEP PREVENTING DEVICE, METHOD OF MANUFACTURING PEEP PREVENTING DEVICE, AND DISPLAY APPARATUS

(71) Applicant: BOE TECHNOLOGY GROUP CO., LTD., Beijing (CN)

(72) Inventors: Zheng Fang, Beijing (CN); Hyunsic Choi, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 549 days.

(21) Appl. No.: 16/333,193

(22) PCT Filed: Aug. 20, 2018

(86) PCT No.: PCT/CN2018/101276
§ 371 (c)(1),
(2) Date: Mar. 13, 2019

(87) PCT Pub. No.: WO2019/076126
PCT Pub. Date: Apr. 25, 2019

(65) Prior Publication Data
US 2021/0341801 A1 Nov. 4, 2021

(30) Foreign Application Priority Data

Oct. 20, 2017 (CN) .......................... 201710990910.2

(51) Int. Cl.
*G02F 1/1343* (2006.01)
*G02F 1/1676* (2019.01)
(Continued)

(52) U.S. Cl.
CPC .. *G02F 1/134309* (2013.01); *G02F 1/133514* (2013.01); *G02F 1/167* (2013.01);
(Continued)

(58) Field of Classification Search
None
See application file for complete search history.

(56) References Cited

U.S. PATENT DOCUMENTS

2002/0039156 A1* 4/2002 Li ........................ G01D 11/28
349/88
2015/0096877 A1 4/2015 Chu

FOREIGN PATENT DOCUMENTS

CN 105425502 A 3/2016
CN 106773444 A 5/2017
(Continued)

OTHER PUBLICATIONS

International Search Report and Written Opinion dated Nov. 16, 2018, for corresponding PCT Application No. PCT/CN2018/101276.

(Continued)

*Primary Examiner* — Ashok Patel
(74) *Attorney, Agent, or Firm* — Kinney & Lange, P.A.

(57) ABSTRACT

Embodiments of the present disclosure disclose a peep preventing device. The peep preventing device includes first electrodes and a transparent insulating body on a transparent substrate. The insulating body has recesses, the first electrodes are located in the recesses, respectively, and an area of a section, taken along a plane parallel to the transparent substrate, of each recess gradually reduces in a direction away from the transparent substrate. The peep preventing device further includes transparent second electrodes each of which includes a second electrode sidewall portion covering a sidewall of one of the recesses. Closed spaces are defined between the insulating body and the second electrodes and the transparent substrate, and electrophoretic liquids are contained in the closed spaces, respectively, and contain reflective charged particles adapted to adhere to the second (Continued)

electrodes when a first electric field is applied between the first electrodes and the second electrodes.

20 Claims, 11 Drawing Sheets

(51) Int. Cl.
    *G02F 1/1335*     (2006.01)
    *G02F 1/167*     (2019.01)
    *H01L 27/32*     (2006.01)
    *G02F 1/1675*     (2019.01)

(52) U.S. Cl.
    CPC .......... *G02F 1/1676* (2019.01); *H01L 27/322* (2013.01); *H01L 27/3232* (2013.01); *G02F 2001/1678* (2013.01); *G02F 2201/44* (2013.01)

(56) References Cited

FOREIGN PATENT DOCUMENTS

| WO | 0201288 A1 | 1/2002 |
| WO | 205038364 U | 2/2016 |
| WO | 2016089957 A1 | 6/2016 |
| WO | 2017095444 A1 | 6/2017 |

OTHER PUBLICATIONS

International Preliminary Report on Patentability, dated Apr. 21, 2020, for corresponding PCT Application No. PCT/CN2018/101276.

Extended European Search Report dated Jun. 16, 2021, received for corresponding European Application No. 18855139.4, 7 pages.

* cited by examiner

PEEP PREVENTING DEVICE, METHOD OF MANUFACTURING PEEP PREVENTING DEVICE, AND DISPLAY APPARATUS

CROSS-REFERENCE TO RELATED APPLICATION

This application is a Section 371 National Stage Application of International Application No. PCT/CN2018/101276, filed on Aug. 20, 2018, entitled "PEEP PREVENTING DEVICE, METHOD OF MANUFACTURING PEEP PREVENTING DEVICE, AND DISPLAY APPARATUS", which has not yet published, which claims priority to Chinese Application No. 201710990910.2, filed on Oct. 20, 2017, incorporated herein by reference in their entirety.

TECHNICAL FIELD

Embodiments of the present disclosure relate to a peep preventing device, a method of manufacturing the peep preventing device, and a display apparatus with the peep preventing device.

BACKGROUND

All of existing displays such as advanced super dimensional switching (ADS) displays have a very great light emergence angle, and a maximum light emergence angle may be even up to 178°. Such a large angle of view gives consumers an excellent user experience in some applications such as TV products, but causes personal information or privacy to divulge in some applications such as personal mobile products or special applications.

For this problem, a peep preventing device for a display, such as a peep preventing film of 3M Company, has been proposed to achieve a convergence of a display angle of the display.

SUMMARY

In accordance with embodiments of a first aspect of the present disclosure, there is provided a peep preventing device comprising: a transparent substrate; a plurality of first electrodes on the transparent substrate; a transparent insulating body on the transparent substrate, wherein the insulating body has a plurality of recesses in one-to-one correspondence with the first electrodes, each of the recesses has an opening facing towards the transparent substrate, the first electrodes are located in the recesses, respectively, and an area of a section, taken along a plane parallel to the transparent substrate, of each of the recesses gradually reduces in a direction away from the transparent substrate; and a plurality of transparent second electrodes each of which comprises a second electrode sidewall portion covering a sidewall of one of the recesses, wherein closed spaces are defined between the insulating body and second electrodes and the transparent substrate, electrophoretic liquids are contained in the closed spaces, respectively, and the electrophoretic liquids contain reflective charged particles adapted to adhere to the second electrodes when a first electric field is applied between the first electrodes and the second electrodes.

According to an embodiment of the present disclosure, the peep preventing device further comprises: a switching device electrically connected with the first electrodes and the second electrodes, and the switching device is configured such that, when the switching device is in a first operating state, the first electric field is applied between the first electrodes and the second electrodes so that the reflective charged particles adhere to the second electrodes; and when the switching device is in a second operating state, a second electric field opposite in direction to the first electric field is applied between the first electrodes and the second electrodes so that the reflective charged particles adhere to the first electrodes.

According to an embodiment of the present disclosure, each of the recesses has two sidewalls each having a plane.

According to an embodiment of the present disclosure, the following relation is satisfied by an angle $\alpha$ between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes: $0° < \alpha \leq \theta$, where $\theta$ is a preset maximal angle between an emergent light and the normal of the transparent substrate.

According to an embodiment of the present disclosure, a value of $\theta$ is 30 degrees.

According to an embodiment of the present disclosure, each of the closed spaces defined between the second electrodes and the transparent substrate has an isosceles trapezoidal section along a plane perpendicular to the transparent substrate, and each of the second electrodes further comprises a second electrode connection portion connecting two second electrode sidewall portions at ends of the two second electrode sidewall portions facing away from the transparent substrate.

According to an embodiment of the present disclosure, each of the closed spaces defined between the second electrodes and the transparent substrate has an isosceles triangular section along a plane perpendicular to the transparent substrate, and two second electrode sidewall portions of each of the second electrodes are directly connected together.

According to an embodiment of the present disclosure, the isosceles trapezoidal section has a base angle that is greater than or equal to 60° and less than 90°.

According to an embodiment of the present disclosure, the isosceles triangular section has a base angle that is greater than or equal to 60° and less than 90°.

According to an embodiment of the present disclosure, the sidewall of each of the recesses has a shape of a concave arc surface depressed towards an inside of the recess.

According to an embodiment of the present disclosure, the following relation is satisfied by an angle $\alpha$ between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes: $0° < \alpha \leq \theta$, where $\theta$ is a preset maximal angle between an emergent light and the normal of the transparent substrate.

According to an embodiment of the present disclosure, the section, taken along the plane parallel to the transparent substrate, of each of the recesses has an elliptical shape or a polygonal shape.

In accordance with embodiments of another aspect of the present disclosure, there is provided a display apparatus comprising the peep preventing device according to the embodiments of the first aspect.

According to an embodiment of the present disclosure, the display apparatus further comprises a color filter substrate, and the peep preventing device is disposed on a light incidence side of the color filter substrate.

According to an embodiment of the present disclosure, the display apparatus further comprises a liquid crystal display panel and a backlight unit, and the peep preventing device is disposed between the liquid crystal display panel and the backlight unit.

According to an embodiment of the present disclosure, the display apparatus further comprises a liquid crystal display panel and a backlight unit, and the peep preventing device is integrated in the liquid crystal display panel, is located between an array substrate and a color filter substrate, or is integrated in the array substrate.

According to an embodiment of the present disclosure, the display apparatus further comprises an organic light-emitting diode panel, and the peep preventing device is disposed in the organic light-emitting diode panel.

In accordance with embodiments of a further aspect of the present disclosure, there is provided a method of manufacturing a peep preventing device, the method comprising: providing a support substrate; forming a layer of a transparent insulating body on the support substrate;

forming a plurality of recesses in the transparent insulating body, wherein each of the recesses comprises two sidewalls inclined away from each other in a direction away from the support substrate; forming a plurality of transparent second electrodes along the recesses of the transparent insulating body, wherein each of the second electrodes comprises a second electrode sidewall portion covering a sidewall of a corresponding one of the recesses; injecting electrophoretic liquids in the recesses formed with the second electrodes; and covering the transparent insulating body with a transparent substrate to define closed spaces between the insulating body and the second electrodes and the transparent substrate so that the electrophoretic liquids are encapsulated in the closed spaces, wherein a plurality of first electrodes are formed on the transparent substrate, and each of the first electrodes is located in a corresponding one of the recesses and is spaced from two sidewalls of the corresponding one of the recesses, wherein the electrophoretic liquids contain reflective charged particles, and the reflective charged particles are adapted such that, when a first electric field is applied between the first electrodes and the second electrodes, the reflective charged particles adhere to the second electrodes, thereby forming a peep preventing mode; and when a second electric field opposite in polarity to the first electric field is applied between the first electrodes and the second electrodes, the reflective charged particles adhere to the first electrodes, thereby forming a non-peep preventing mode.

According to an embodiment of the present disclosure, the following relation is satisfied by an angle $\alpha$ between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes: $0°<\alpha\leq\theta$, where $\theta$ is a preset maximal angle between an emergent light and the normal of the transparent substrate.

According to an embodiment of the present disclosure, the method further comprises a step of stripping the support substrate after the transparent substrate is formed.

In accordance with embodiments of a further aspect of the present disclosure, there is provided a peep preventing device comprising: a transparent substrate; a plurality of first electrodes on the substrate; a transparent insulating body on the substrate, wherein the insulating body has a plurality of through holes in one-to-one correspondence with the first electrodes, the first electrodes are located in the through holes, respectively, and an area of a section, taken along a plane parallel to the transparent substrate, of each of the through holes gradually reduces in a direction away from the substrate; and a plurality of transparent second electrodes formed at the through holes of the insulating body to partially surround the first electrodes, respectively, wherein closed spaces are defined between the second electrodes and the substrate, respectively, and electrophoretic liquids are contained in the closed spaces, respectively, and the electrophoretic liquids contain reflective charged particles adapted to adhere to the second electrodes when a first electric field is applied between the first electrodes and the second electrodes.

In order that the objects, advantages, and features of the present disclosure become more apparent and are more readily appreciated, a further description of the present disclosure will be made as below with reference to embodiments of the present disclosure taken in conjunction with the accompanying drawings.

DETAILED DESCRIPTION

Figure 1A:
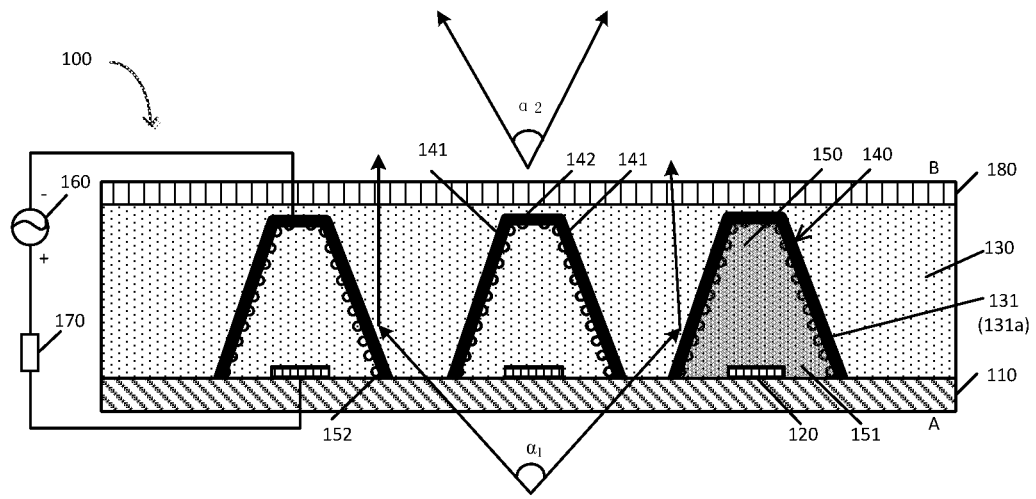
FIG. 1A is a schematic sectional view of a peep preventing device, in a peep preventing state, according to an embodiment of the present disclosure.

Embodiments of the present disclosure will be described as follows with reference to the accompanying drawings. It should be understood, however, that the description is only illustrative, and is not intended to limit the scope of the present disclosure. In addition, descriptions of well-known structures and techniques are omitted in the following explanation in order to avoid unnecessarily obscuring the concept of the present disclosure.

In the drawings, the figures schematically show various structures in accordance with embodiments of the present disclosure. The figures are not drawn to scale, and some details are enlarged and some other details may be omitted for the purpose of clear illustration. Various shapes of regions and layers, and relative sizes and positional relationships between the regions and layers, shown in the figures are merely exemplary. In practice, there may be deviations due to manufacturing tolerances or technical limitations, and those skilled in the art may additionally design regions/layers having different shapes, sizes, and relative positions according to actual needs.

In the context of the present disclosure, when a layer/element is referred to as being "on" another layer/element, the layer/element may be directly on the other layer/element, or there may be an intermediate layer/element between them. In addition, if a layer/element is "on" another layer/element in an orientation, the layer/element may be "under" the other layer/element when the orientation is reversed.

FIG. 1A is a schematic sectional view of a peep preventing device 100, in a peep preventing state, according to an embodiment of the present disclosure. As shown in FIG. 1A, the peep preventing device 100 includes: a substrate 110, a plurality of first electrodes 120 on the substrate 110, an insulating body 130 on the substrate 110 (it should be noted that "on" refers to the positional relationship between them, and does not necessarily mean that the insulating body 130 is fixed to or formed on the substrate 110), and a plurality of second electrodes 140, which are arranged in sequence from a light incidence side A to a light emergence side B. All of the substrate 110, the first electrodes 120, the insulating body 130, and the second electrodes 140 are made of transparent materials. The substrate 110 is, for example, a glass substrate. The insulating body 130 may be made of, for example, a material such as photosensitive polyimide, PC (polycarbonate), or PMMA (polymethyl methacrylate). The first electrodes 120 and the second electrodes 140 are made of, for example, a transparent conductive material such as an indium tin oxide (ITO). Optionally, the peep preventing device 100 further includes a transparent cover plate 180 to protect the second electrodes 140.

The plurality of first electrodes 120 each having, for example, a strip shape are arranged in parallel on the substrate 110. The insulating body 130 has a plurality of recesses 131 extending in a length direction of the first electrodes 120, and a width of a cross section, perpendicular to the length direction, of each of the recesses 131 gradually reduces in a direction away from the substrate 110. Each of the recesses 131 has an opening at an end facing towards the substrate 110, and the first electrodes 120 are located in the openings, respectively. An end, facing away from the substrate 110, of each of the recesses 131 may be closed or open. In the case where the end is open, the recess is in the form of a through hole. In the embodiment shown in FIG. 1A, the end, facing away from the substrate 110, of each of the recesses 131 is closed. In this case, after the transparent cover plate 180 is stripped, the insulating body 130 can protect the second electrodes 140, so that a peep preventing structure has a better stability.

Figure 1B:
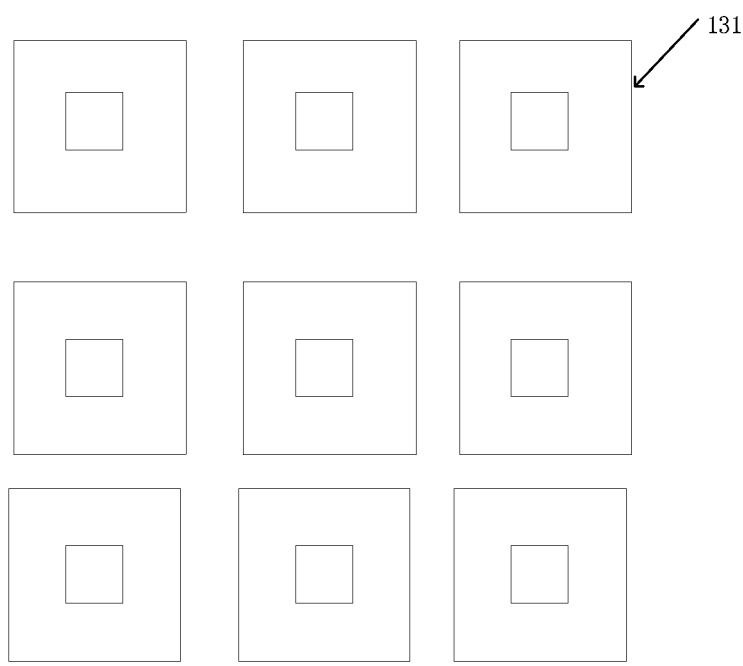
FIG. 1B is a schematic top view showing an embodiment of a recess of an insulating body of the peep preventing device shown in FIG. 1A.

Referring to FIG. 1B, projections of the plurality of recesses 131 on the substrate 110 may be arranged in a matrix, each recess may have a frustoconical or frustopyramidal shape or a conical or pyramidal shape, and the section, along the plane parallel to the substrate 110, of each of the recesses 131 may have an elliptical shape, a circular shape, or a polygonal shape such as a quadrilateral shape, a hexagonal shape, or an octagonal shape. An area of the section, along the plane parallel to the substrate 110, of each of the recesses 131 gradually reduces in the direction away from the substrate 110.

Figure 1C:
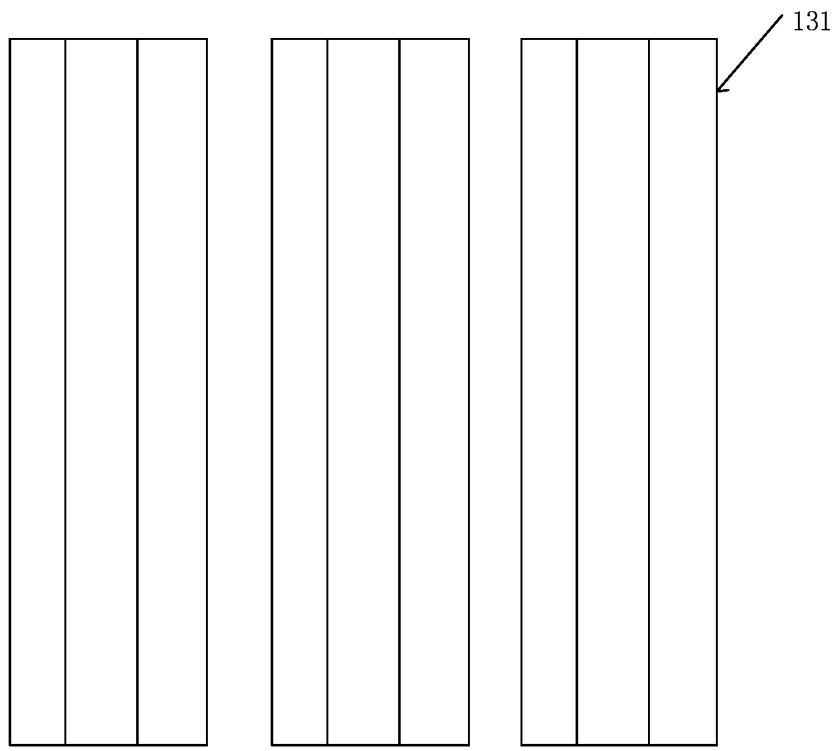
FIG. 1C is a schematic top view showing another embodiment of the recess of the insulating body of the peep preventing device shown in FIG. 1A.

Alternatively, as shown in FIG. 1C, projections of the plurality of recesses 131 on the substrate 110 may be substantially parallel to one another and may extend in a height direction of the substrate 110 (in the case where the substrate 110 is upright placed). The area of the section, along the plane parallel to the substrate 110, of each of the recesses 131 gradually reduces in the direction away from the substrate 110, or a width of a cross section, along a plane perpendicular to the substrate 110, of each of the recesses 131 gradually reduces in the direction away from the substrate 110.

The plurality of second electrodes 140 are formed along the recesses 131 of the insulating body 110, respectively, for example, each of the second electrodes 140 includes second electrode sidewall portions 141 covering two sidewalls 131a of one of the recesses 131, and each of the second electrodes 140 partially surrounds one of the first electrodes 120. Closed spaces 150 are defined between the insulating body 130 and the second electrodes 140 and the substrate 110, and electrophoretic liquids 151 are contained in the closed spaces 150, respectively, and the electrophoretic liquids contain reflective charged particles 152. The second electrodes 140 may extend to the substrate 110 so that a seal is formed between each of the second electrodes and the substrate 110, or the second electrodes 140 may not extend to the substrate 110, and a seal is formed between each of the sidewalls 131a of the recesses 131 and the substrate 110. The first electrodes 120 and the second electrodes 140 are connected to a power source 160 through lead wires. The reflective charged particles 152 are adapted to adhere to the second electrodes 140 when a first electric field is applied between the first electrodes 120 and the second electrodes 140. The reflective charged particles 152 are, for example, metal particles such as Ag particles and Al particles, and the electrophoretic liquid 151 is, for example, an electroplating solution such as a silver iodide solution or a silver chloride solution.

When the first electric field is applied between the first electrodes 120 and the second electrodes 140, for example, a low electric potential is applied to the second electrodes 140 and a high electric potential is applied to the first electrodes 120, the reflective charged particles 152 adhere to the second electrodes 140 under the action of the electric field. FIG. 1A shows a state where the reflective charged particles 152 adhere to the second electrodes 140. In this state, as shown in FIG. 1A, a light beam having a diffusion angle α1 and coming from the light incidence side A is irradiated on the second electrodes 140. After being reflected by the reflective charged particles 152 adhering to the second electrodes 140, the light beam is converged on the light emergence side B. A viewing effect is like a light beam emerging at a small diffusion angle α2, thereby forming a narrow-viewing angle peep preventing mode, which can achieve a peep preventing effect and prevent personal information or privacy from divulging. In addition, in the peep preventing mode, more light is reflected by the reflective charged particles 152 and is concentrated in a perpendicular viewing direction (a normal direction of the substrate 110). As a result, a luminance in the perpendicular viewing direction can be increased, thereby solving a problem of lowering the luminance in the perpendicular viewing direction in the case where the peep preventing film is used, and improving a user experience.

Figure 1D:
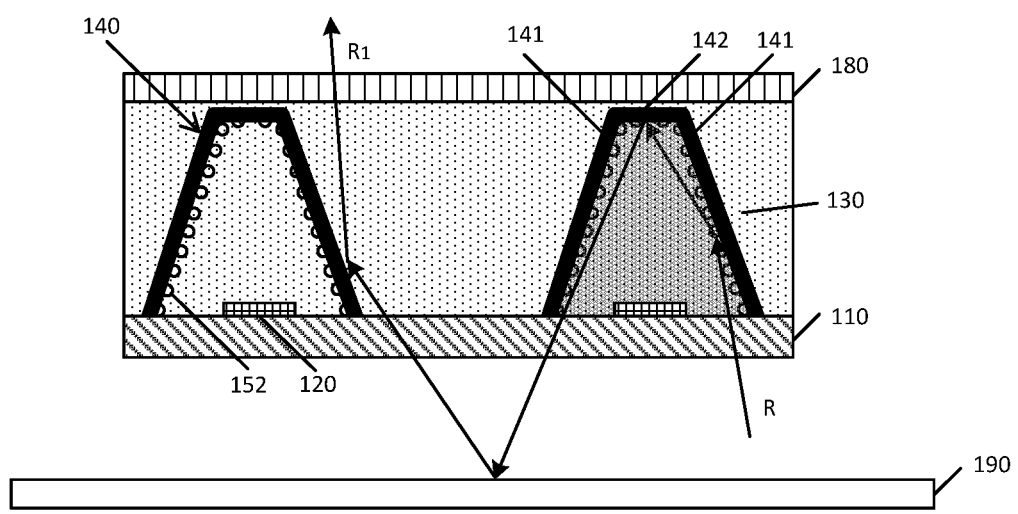
FIG. 1D is another schematic sectional view of the peep preventing device, in the peep preventing state, shown in FIG. 1A.

It should be noted that, as shown in FIG. 1D, in the peep preventing mode, even if a part of the light R is irradiated on lower sides of the second electrodes 140, the part of the light R is reflected multiple times and finally emerges as an emergent light R1 with a narrow viewing angle, so that the peed preventing effect will not be adversely affected. FIG. 1D shows a reflection element 190 on the light incidence side of the peep preventing device. For example, the reflection element 190 may be a reflection element in a backlight unit of a liquid crystal display apparatus, or a reflection element in an organic light-emitting diode display apparatus.

Figure 1E:
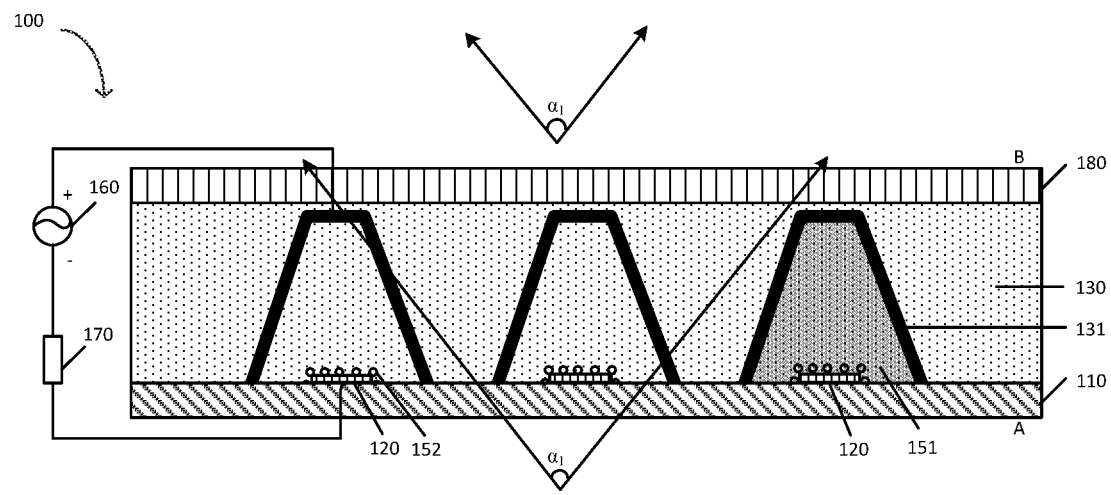
FIG. 1E is a schematic sectional view of the peep preventing device, in a non-peep preventing state, shown in FIG. 1A.

On the other hand, as shown in FIG. 1E, when a second electric field is applied between the first electrodes 120 and the second electrodes 140, for example, the high electric potential is applied to the second electrodes 140 and the low electric potential is applied to the first electrodes 120, the reflective charged particles 152 adhere to the first electrodes 120 under the action of the electric field. FIG. 1E shows a state where the reflective charged particles 152 adhere to the first electrodes 120. In this state, as shown in FIG. 1E, the light beam having the diffusion angle α1 and coming from the light incidence side A is irradiated on the second electrodes 140, and passes through the transparent second electrodes to normally emerge on the light emergence side. On the light emergence side B, the diffusion angle of the light is still α1, thereby forming a wide-viewing angle non-peep preventing mode, which achieves a wide-viewing angle display and improves a user's viewing experience.

Figure 1F:
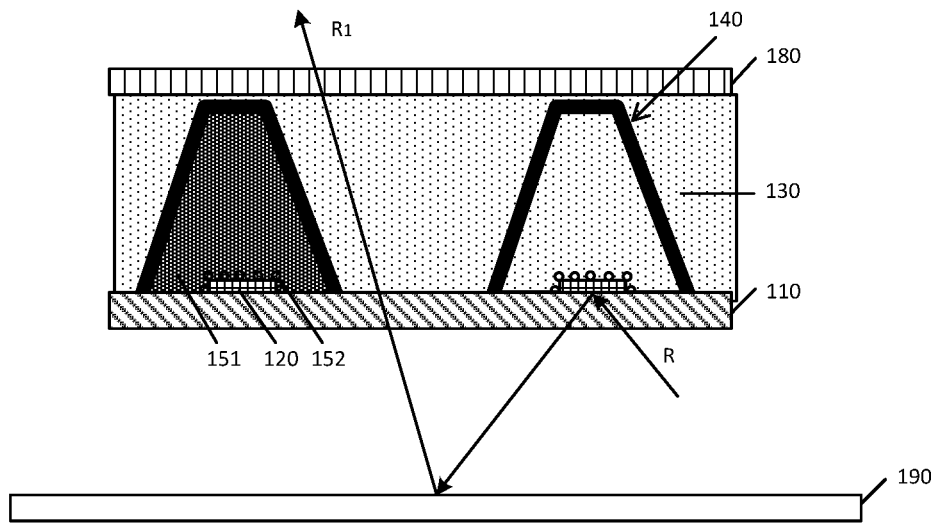
FIG. 1F is another schematic sectional view of the peep preventing device, in the non-peep preventing state, shown in FIG. 1A.

It should be noted that, as shown in FIG. 1F, in the non-peep preventing mode, even if a part of the light R is irradiated on lower sides of the first electrodes 120, the part of the light R is reflected and finally emerges as an emergent light R1 with a wide viewing angle, so that the wide-viewing angle display will not be adversely affected. FIG. 1F shows a reflection element 190 on the light incidence side of the peep preventing device. For example, the reflection element 190 may be a reflection element in a backlight unit of a liquid crystal display apparatus, or a reflection element in an organic light-emitting diode display apparatus.

According to an exemplary embodiment, as shown in FIGS. 1A and 1E, the peep preventing device 100 further includes a switching device 170 electrically connected with the first electrodes 120 and the second electrodes 140. The switching device 170 may be, for example, a bridge polarity reversing switching circuit and is configured to change a direction of an electric field applied between the first electrodes 120 and the second electrodes 140.

As shown in FIG. 1A, when the switching device 170 is in a first operating state, a first electric field is applied between the first electrodes 120 and the second electrodes 140 so that the reflective charged particles 152 adhere to the second electrodes 140, thereby forming a peep preventing mode. In contrast, as shown in FIG. 1E, when the switching device 170 is in a second operating state, a second electric field opposite in direction to the first electric field is applied between the first electrodes 120 and the second electrodes 140 so that the reflective charged particles 152 adhere to the first electrodes 120, thereby forming a non-peep preventing mode.

Figure 1G:
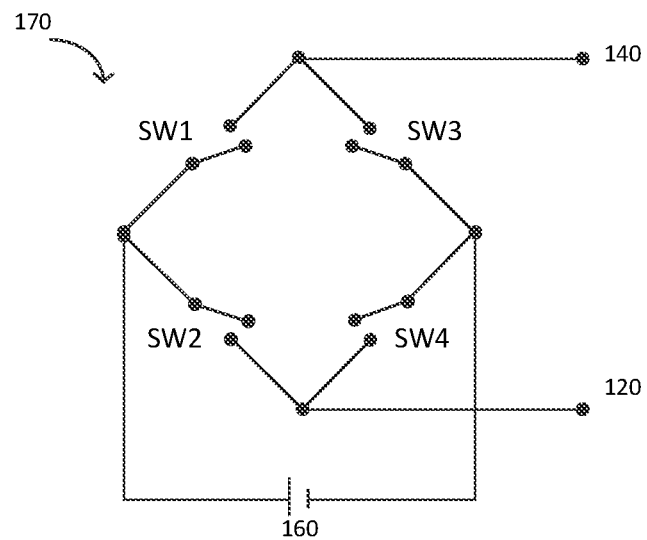
FIG. 1G is a schematic diagram showing an example of an electric field switching device in the peep preventing device shown in FIG. 1A.

FIG. 1G is a schematic diagram showing an example of the switching device 170 shown in FIG. 1A. As shown in FIG. 1G, the switching device 170 includes four switches SW1, SW2, SW3 and SW4. When the switches SW2 and SW3 are opened while the switches SW1 and SW4 are closed, the second electrodes 140 are connected to a positive electrode, and the first electrodes 120 are connected to a negative electrode. When the switches SW1 and SW4 are opened while the switches SW2 and SW3 are closed, the second electrodes 140 are connected to the negative electrode, and the first electrodes 120 are connected to the positive electrode. Therefore, a direction of an electric field applied between the first electrodes 120 and the second electrodes 140 can be changed by setting an open state and a closed state of each of the switches.

In this way, the peep preventing device according to the embodiment can be freely switched between the peep preventing mode and the non-peep preventing mode by means of the switching device 170, thereby meeting usage needs of a user in different usage conditions and improving usage convenience of the user.

According to a specific embodiment, as shown in FIG. 1A, each of the recesses 131 has two sidewalls 131a each having a plane. An isosceles trapezoidal section is defined between each of the recesses 131 and the substrate 110. In other words, each of the closed spaces 150 defined by the second electrodes 140 and the substrate 110 has an isosceles trapezoidal section along a plane perpendicular to the substrate. Each of the second electrodes 140 includes: second electrode sidewall portions 141 covering two sidewalls 131a of one of the recesses 131; and a second electrode connection portion 142 connecting the two second electrode sidewall portions 141 at ends of the two second electrode sidewall portions 141 facing away from the substrate 110. In other words, the second electrode sidewall portions 141 constitute left and right sides of the isosceles trapezoid which are equal to each other, the second electrode connection portion 142 constitutes an upper side of the isosceles trapezoid, and a portion of the substrate 110 which is located in the recess 131 constitutes a lower side of the isosceles trapezoid. Since the second electrode 140 has the isosceles trapezoidal section, the second electrode sidewall portions 141 of the second electrode can have a great inclination. Therefore, more light can be reflected to be in the perpendicular viewing direction (i.e. the normal direction of the substrate 110) in the peep preventing mode. As a result, the luminance in the perpendicular viewing direction is increased, thereby solving the problem of lowering the luminance in the perpendicular viewing direction in the case where the peep preventing film is used, and improving the user experience.

Figure 1H:
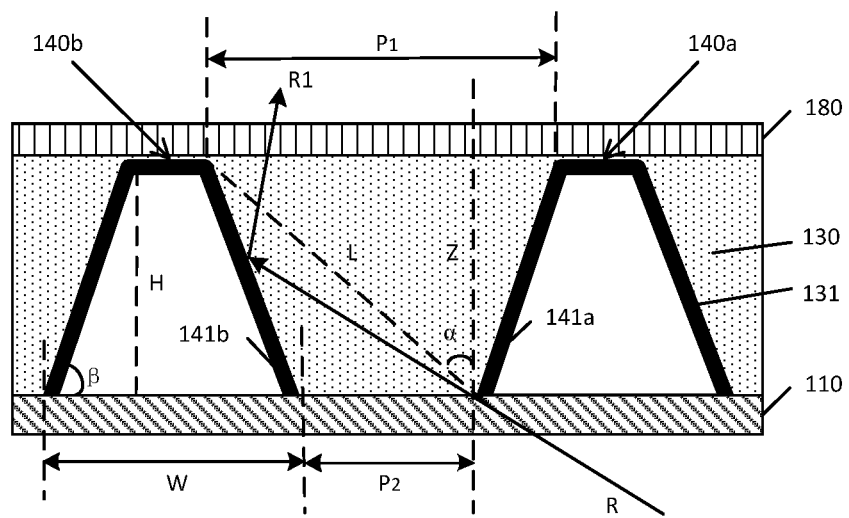
FIG. 1H is a schematic view showing a size of the recess of the insulating body of the peep preventing device shown in FIG. 1A.

FIG. 1H is a schematic view showing a size of the recess 131 of the insulating body 130 shown in FIG. 1A according to an embodiment of the present disclosure. Illustrations of the first electrodes 120, the electrophoretic liquid 151 and the reflective charged particles 152 are omitted for the convenience of illustration. As shown in FIG. 1H, in order to ensure that all of the incident light beyond a predetermined diffusion angle range (for example 30 degrees) can be reflected and corrected such that an angle of an emergent light is limited within the predetermined angle range, sizes of the recesses 131 are designed such that the second electrodes 140 formed on the recesses satisfy the following relation:

$$0° < \alpha \leq \theta \quad (1)$$

where α is an angle between a normal Z of the substrate 110 and a line L connecting a bottom end of a second electrode sidewall portion 141a of one 140a of two adjacent second electrodes 140a and 140b and a top end of a second electrode sidewall portion 141b, adjacent to the second electrode sidewall portion 141a, of the other 140b of the two adjacent second electrodes 140a and 140b, and θ is a preset maximal angle between an emergent light R1 and the normal Z of the substrate 110.

For example, θ may be set to be 30 degrees according to requirements. In this way, when 0°<α≤30°, it can be ensured that all of a portion of an incident light R having an incident angle beyond 30 degrees can be reflected and corrected by the second electrode sidewall portions 141 in the peep preventing mode, so that the emergent light R1 is reflected towards a perpendicular viewing angle, achieving a peep preventing effect. It should be understood by those skilled in the art that θ may be set to be a greater or smaller angle according to requirements. Within the range of the angle θ, the smaller the angle α is, the more a luminance in a central portion is increased and the better the peep preventing effect is.

A size of the recesses 131 and a distance between the recesses 131 may be specifically designed according to the formula (1). As shown in FIG. 1H, according to a geometrical relation, a base angle β of the isosceles trapezoidal section satisfies the following formula (2):

$$\beta > (90-\alpha)° \quad (2)$$

if 0°<α≤30°, then 60°≤β<90°.

A height H of the isosceles trapezoidal section, and a distance P1 between top ends of the recesses 131 (the isosceles trapezoidal sections) satisfy the following relation (3):

$$P1 = H*\tan(\alpha) + H*\tan(90-\beta) \quad (3)$$

The height H of the isosceles trapezoidal section, and a distance P2 between bottom ends of the recesses 131 (the isosceles trapezoidal sections) satisfy the following relation (4):

$$P2 = H*\tan(\alpha) - H*\tan(90-\beta) \quad (4)$$

According to the formulas, for example, assuming H=10 μm, α=30°, and β=75°, then P2=3.1 μm and P1=8.5 μm. Thereby, the size of the peep preventing device can be specifically designed to achieve an expected peep preventing effect.

According to a specific example, in order to satisfy the formulas (1) to (4) in synthetic consideration of technology and design requirements, as shown in FIG. 1H, the base angle β of the isosceles trapezoidal section may be selected to be generally between 60° and 90° (i.e. greater than or equal to 60° and less than 90°). The height H of the isosceles trapezoidal section may be set to be about 10 μm, and the distance P1 between the top ends of the recesses 131 (the isosceles trapezoidal sections) may be set to be about 8.5 μm. Further, for the convenience of design, a length W of the lower side of the isosceles trapezoidal section may be designed to be equal to the distance P1 between the top ends of the recesses 131 (the isosceles trapezoidal sections). For example the length W is selected to be about 8.5 μm. The length W of the lower side of the isosceles trapezoidal section has less influence on an emergence angle of the light, and thus may also be selected to be any other value.

Figure 2:
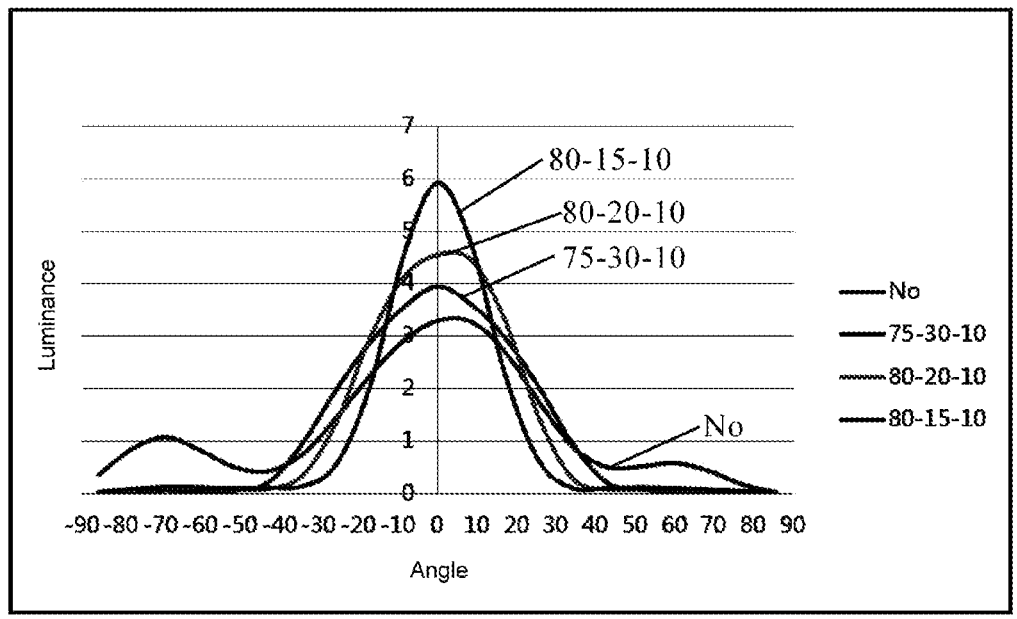
FIG. 2 shows a result of a simulated detection of a peep preventing effect of the peep preventing device shown in FIG. 1A.

FIG. 2 shows a result of a simulated detection of a peep preventing effect of a display panel using the peep preventing device shown in FIG. 1A. A Model is built and a detection is performed by means of a simulation software (Lighttool). As shown in FIG. 2, the abscissa indicates the angle value, 0 degrees indicates the perpendicular viewing direction, and the ordinate indicates the luminance value. "75-30-10" indicates a luminance distribution curve on the light emergence side of the display panel in the case where the angle β is 75 degrees, the angle α is 30 degrees, and H is 10 μm; "80-20-10" indicates a luminance distribution curve on the light emergence side of the display panel in the case where the angle β is 80 degrees, the angle α is 20 degrees, and H is 10 μm; "80-15-10" indicates a luminance distribution curve on the light emergence side of the display panel in the case where the angle β is 80 degrees, the angle α is 15 degrees, and H is 10 μm; and "No" indicates a luminance distribution curve on the light emergence side of the display panel without the peep preventing device. It can be seen from FIG. 2 that in the luminance distribution curve indicated by "80-15-10", the angle of the emergent light is converged to be within 30° and the luminance at the central angle increases about two times, compared with the luminance distribution curve of the display panel without the peep preventing device which is indicated by "No".

Figure 3:
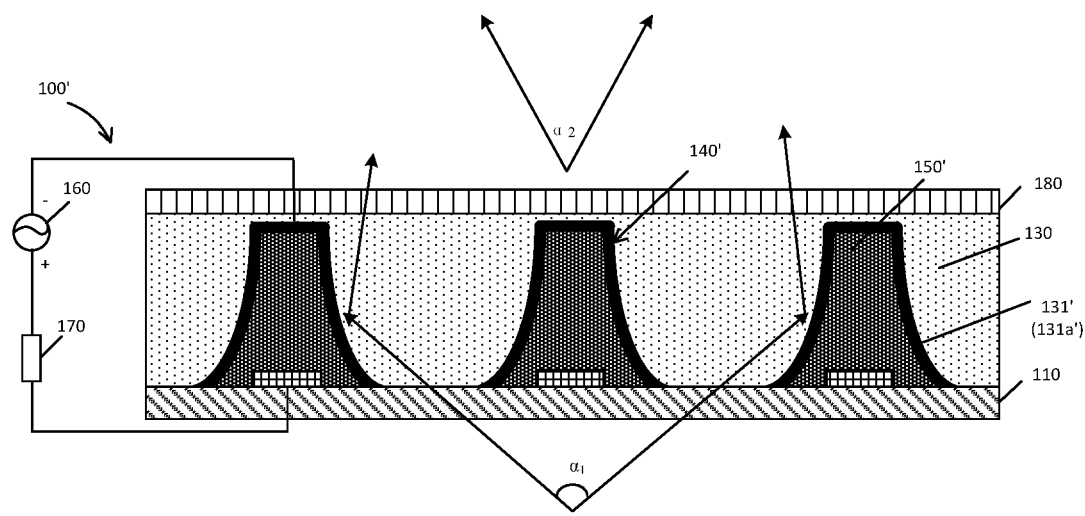
FIG. 3 is a schematic sectional view showing an embodiment of a modification to the peep preventing device shown in FIGS. 1A-1F.

FIG. 3 is a schematic sectional view showing a peep preventing device 100' according to an embodiment of a modification to the peep preventing device shown in FIG. 1A. The present embodiment is different from the embodiment shown in FIG. 1A in that each of recesses 131' has an irregular isosceles trapezoidal section. Specifically, each of two sidewalls 131a' of the recess 131' has a shape of a concave arc surface depressed towards an inside of the recess. Accordingly, each of closed spaces 150' defined by the substrate 110 and second electrodes 140' formed on the recesses 131' has an irregular isosceles trapezoidal section. The peep preventing device according to the present embodiment can also achieve a peep preventing function, and can better increase the luminance at the perpendicular viewing angle in the peep preventing mode. The other aspects of the present embodiment are the same as those of the embodiment shown in FIG. 1A, and are no longer described herein for the sake of brevity.

FIGS. 4A-4F are schematic views showing a process of manufacturing the peep preventing device shown in FIG. 1A according to an embodiment of the present disclosure.

Figure 4A:
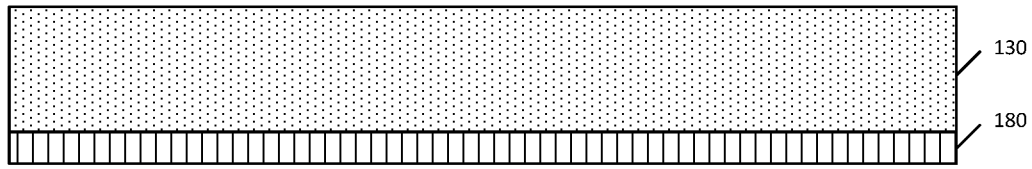
FIGS. 4A-4F are schematic views showing a process of manufacturing the peep preventing device shown in FIG. 1A according to an embodiment of the present disclosure.

As shown in FIG. 4A, firstly, a support substrate (cover plate) 180 is provided, and a layer of a transparent insulating body 130 is formed on the support substrate 180. The support substrate 180 is, for example, a glass substrate. The insulating body 130 is formed, for example, by applying a photosensitive polyimide resin to the support substrate 180.

Figure 4B:
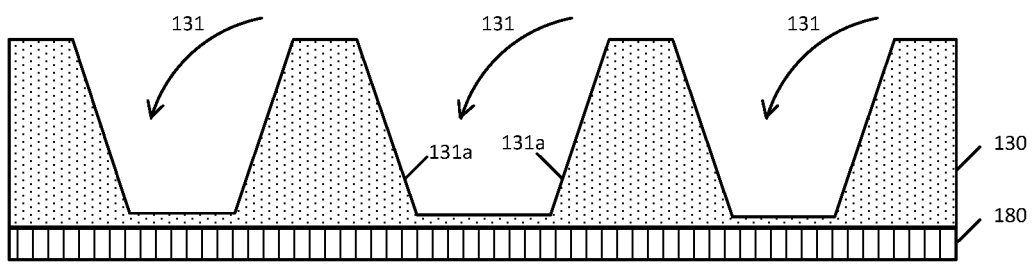

As shown in FIG. 4B, a plurality of recesses 131 each extending in a strip shape is formed in the transparent insulating body 130. Each of the recesses 131 includes two sidewalls 131a inclined away from each other in a direction away from the support substrate 180. Optionally, the recesses 131 are formed by patterning the insulating body 130 made of the photosensitive resin by means of a photolithographic process. According to a material of the insulating body 130, the recesses 131 may also be formed by a process such as molding. The process is not limited in the present disclosure.

Figure 4C:
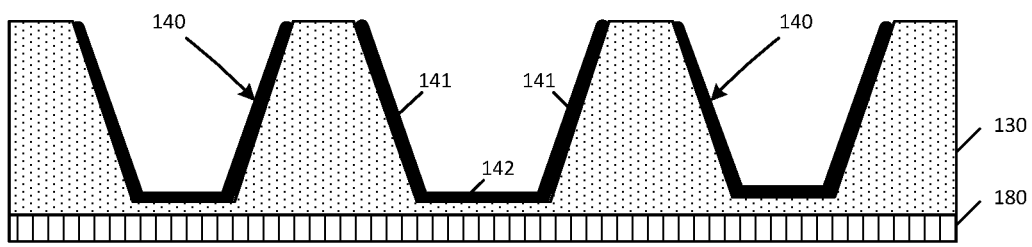

As shown in FIG. 4C, a plurality of transparent second electrodes 140 are formed along the recesses 131 of the transparent insulating body 130. Specifically, for example, an indium tin oxide (ITO) electrode layer is deposited on the transparent insulating body 130 by a vapor deposition, and then the ITO electrode layer is patterned by a photolithographic process, thereby manufacturing the plurality of second electrodes 140 extending along the recesses 131. Each of the second electrodes 140 includes second electrode sidewall portions 141 covering two sidewalls 131a of a corresponding one of the recesses 131. As shown in FIG. 4C, in the case where each of recesses 131 has an isosceles trapezoidal section, each of the second electrodes 140 further includes a second electrode connection portion 142 formed on a bottom of the recess 131, i.e. on the insulating body 130. The second electrode connection portion 142 connects the two second electrode sidewall portions 141.

Figure 4D:
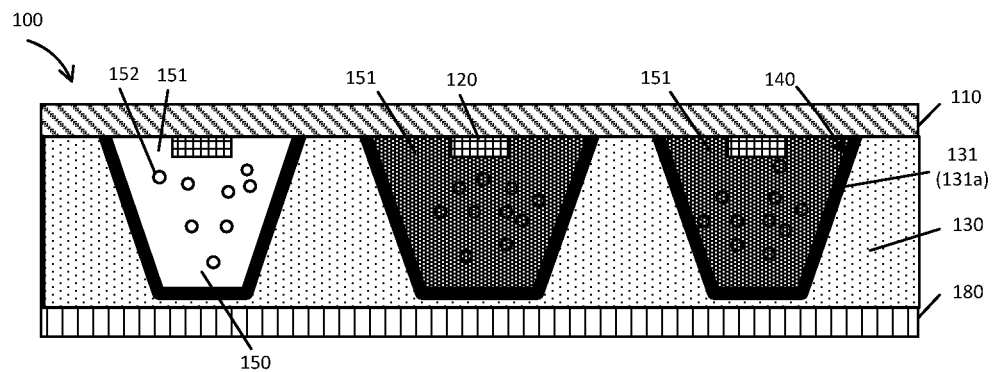

As shown in FIG. 4D, electrophoretic liquids 151 are injected in the recesses 131 formed with the second electrodes 140. Optionally, the electrophoretic liquid is a solution, such as a silver iodide solution or a silver chloride solution, containing reflective charged particles 152. Then, the transparent insulating body 130 is covered with a transparent substrate 110 to define closed spaces 150 between the second electrodes 140 and the substrate 110 so that the electrophoretic liquids 151 are encapsulated in the closed spaces 150. A plurality of first transparent strip-shaped electrodes 120 are formed on the substrate 110 in advance. Each of the first electrodes 120 is located in a corresponding one of the recesses 131 and is spaced from second electrodes 140 on two sidewalls 131a of the corresponding one of the recesses 131, so that each of the second electrodes 140 partially surrounds one of the first electrodes 120. In this way, an inverted peep preventing device 100 shown in FIG. 1A is obtained.

Although not shown in the figures, those skilled in the art can understand that when the second electrodes 140 are manufactured, a second lead wire leading out from the second electrodes 140 may be simultaneously manufactured. A first lead wire leading out from the first electrodes 120 may also be manufactured on the substrate 110 in advance. In this way, the first electrodes 120 and the second electrodes 140 may be connected to an external power source (for example the power source 160 shown in FIG. 1A) through the first lead wire and the second lead wire, respectively, so that an electric field is applied between the first electrodes 120 and the second electrodes 140. Optionally, a switching device (referring to the switching device 170 shown in FIG. 1A) may further be connected between the first electrodes 120 and the second electrodes 140, so that a direction of the electric field is switched.

Figure 4E:
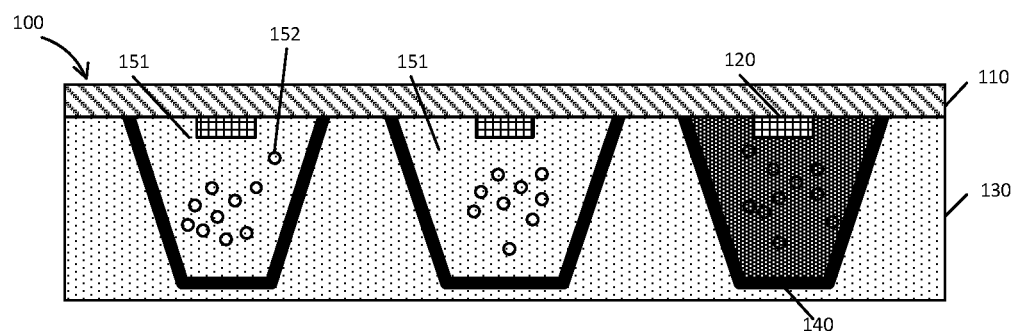

Optionally, as shown in FIG. 4E, after the electrophoretic liquids 151 are encapsulated by the substrate 110, the support substrate 180 of the peep preventing device 100 may be stripped from the insulating body 130.

Figure 4F:
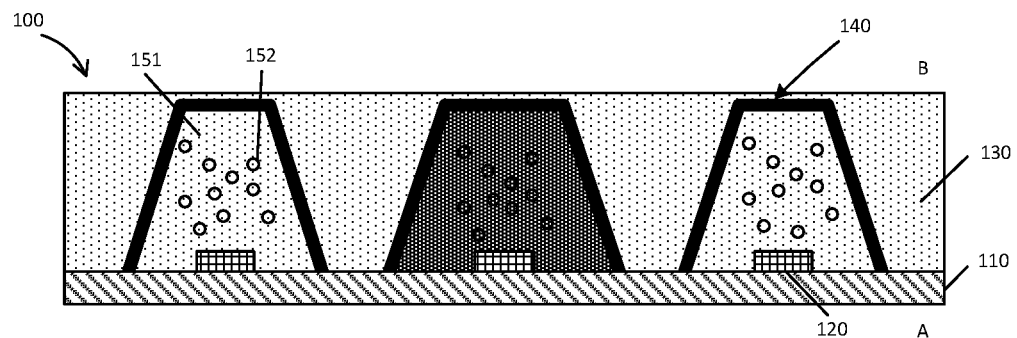

Then, as shown in FIG. 4F, the peep preventing device 100 is turned upside down. After that, in the case where the peep preventing device 100 is integrated in a display apparatus, other elements such as pixel structures may also be continuously manufactured on the peep preventing device 100 with the peep preventing device 100 as a substrate.

In use, a lower side of the peep preventing device 100 shown in FIG. 4F, i.e. a side of the peep preventing device 100 where the substrate 110 is located, is a light incidence side A, while an upper side of the peep preventing device 100 is a light emergence side B. As shown in FIG. 1A, when a light from the light incidence side A is irradiated on the peep preventing device 100, the reflective charged particles 152 in the electrophoretic liquids 151 adhere to the second electrodes 140 when a first electric field is applied between the first electrodes 120 and the second electrodes 140, thereby forming a peep preventing mode. As shown in FIG. 1D, the reflective charged particles 152 in the electrophoretic liquids 151 adhere to the first electrodes 120 when a second electric field opposite in polarity to the first electric field is applied between the first electrodes 120 and the second electrodes 140, thereby forming a non-peep preventing mode.

The peep preventing device manufactured by the method according to the present disclosure can be freely switched between the peep preventing mode and the non-peep preventing mode, thereby meeting usage needs of a user in different usage conditions and improving convenience of the user. In addition, the luminance in the perpendicular viewing angle can be increased in the peep preventing mode, thereby solving the problem of lowering the luminance in the perpendicular viewing direction in the case where the peep preventing film is used, and improving the user experience.

An exemplary embodiment of the method of manufacturing the peep preventing device 100 is illustrated above. It should be understood by those skilled in the art that the peep preventing device 100 may also be manufactured by any other process. The process is not limited in the present disclosure.

Figure 5A:
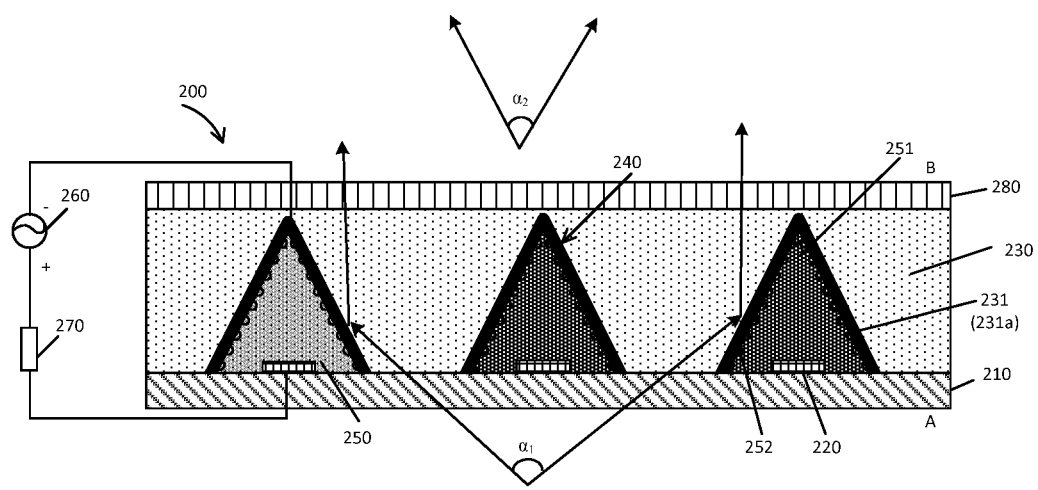
FIGS. 5A-5C are schematic sectional views of a peep preventing device according to another embodiment of the present disclosure.

FIG. 5A is a schematic sectional view of a peep preventing device 200 according to another embodiment of the present disclosure. As shown in FIG. 5A, the peep preventing device 200 includes: a substrate 210, a plurality of first electrodes 220, an insulating body 230, and a plurality of second electrodes 240, which are arranged in sequence from a light incidence side A to a light emergence side B. All of the substrate 210, the first electrodes 220, the insulating body 230, and the second electrodes 240 are made of transparent materials. Optionally, the peep preventing device 200 further includes a transparent cover plate 280 to protect the second electrodes 240.

The plurality of first electrodes 220 each having, for example, a strip shape are arranged in parallel on the substrate 210. The insulating body 230 has a plurality of recesses 231 extending in a length direction of the first electrodes 220, and a width of a cross section, perpendicular to the length direction, of each of the recesses 231 gradually reduces in a direction away from the substrate 210. The plurality of second electrodes 240 are formed on the recesses 231 of the insulating body 230 respectively, to partially surround the first electrodes 220. Closed spaces 250 are defined between the second electrodes 240 and the substrate 210, and electrophoretic liquids 251 are contained in the closed spaces 250, respectively, and the electrophoretic liquids 251 contain reflective charged particles 252. The first electrodes 220 and the second electrodes 240 are connected to a power source 260 through lead wires. The reflective charged particles 252 are adapted to adhere to the second electrodes 240 when a first electric field is applied between the first electrodes 220 and the second electrodes 240.

When the first electric field is applied between the first electrodes 220 and the second electrodes 240, for example, a low electric potential is applied to the second electrodes 240 and a high electric potential is applied to the first electrodes 220, the reflective charged particles 252 adhere to the second electrodes 240 under the action of the electric field. FIG. 5A shows a state where the reflective charged particles 252 adhere to the second electrodes 240. In this state, as shown in FIG. 5A, a light beam having a diffusion angle α1 and coming from the light incidence side A is irradiated on the second electrodes 240. After being reflected by the reflective charged particles 252 adhering to the second electrodes 240, the light beam is converged on the light emergence side B, and emerges at a diffusion angle α2, thereby forming a narrow-viewing angle peep preventing mode, which can achieve a peep preventing effect and prevent personal information or privacy from divulging.

Figure 5B:
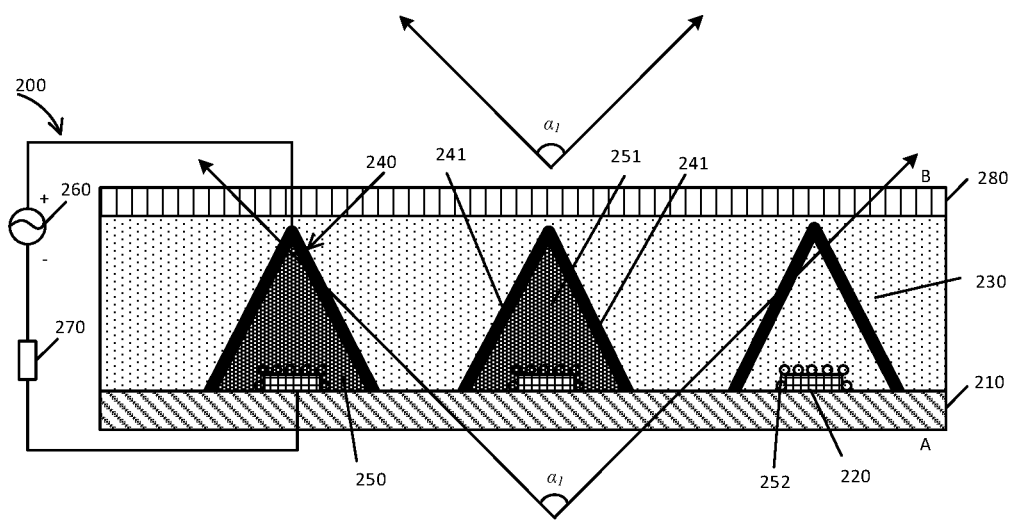

On the other hand, As shown in FIG. 5B, when a second electric field is applied between the first electrodes 220 and the second electrodes 240, for example, the high electric potential is applied to the second electrodes 240 and the low electric potential is applied to the first electrodes 220, the reflective charged particles 252 adhere to the first electrodes 220 under the action of the electric field. FIG. 5B shows a state where the reflective charged particles 252 adhere to the first electrodes 220. In this state, as shown in FIG. 5B, the light beam having the diffusion angle α1 and coming from the light incidence side A is irradiated on the second electrodes 240, and passes through the transparent second electrodes 240 to normally emerge on the light emergence side. On the light emergence side B, the diffusion angle of the light is still α1, thereby forming a wide-viewing angle non-peep preventing mode, which achieves a wide-viewing angle display and improves a user's viewing experience.

According to the embodiment, the peep preventing device 200 may also include a switching device 270, such that the peep preventing device 200 is freely switched between the peep preventing mode and the non-peep preventing mode by means of the switching device 270, thereby meeting usage needs of a user in different usage conditions and improving usage convenience of the user.

The present embodiment is different from the embodiment shown in FIGS. 1A-1E in that an isosceles triangular section is defined between each of the recesses 231 and the substrate 210. In other words, each of the closed spaces 250 defined by the second electrodes 240 and the substrate 210 has an isosceles triangular section along a plane perpendicular to the substrate. Each of the second electrodes 240 includes only second electrode sidewall portions 241 covering two sidewalls of one of the recesses 231, and the two second electrode sidewall portions 241 are directly connected together. The peep preventing device according to the present embodiment can also achieve a peep preventing function, and can increase the luminance at the perpendicular viewing angle in the peep preventing mode.

Figure 5C:
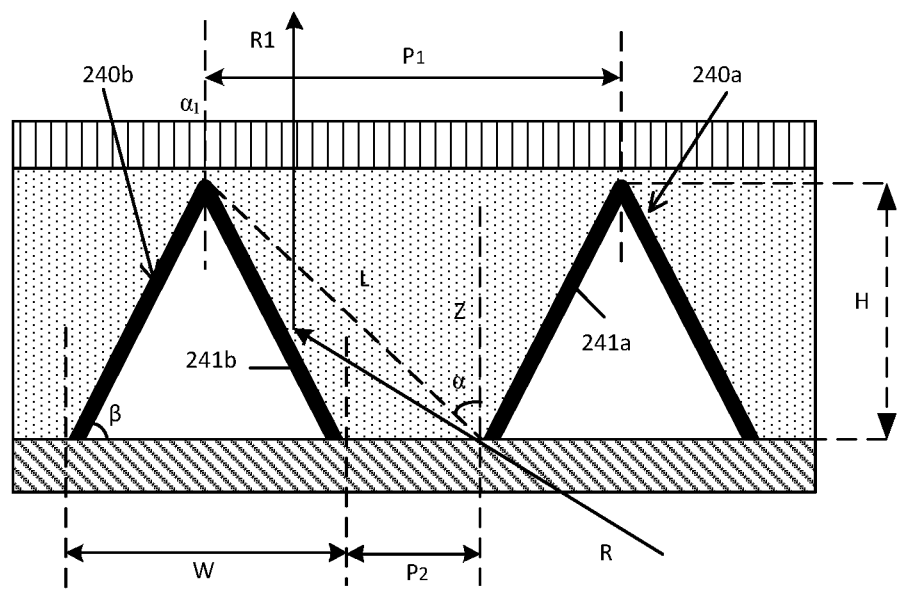

FIG. 5C is a schematic view showing a size of the recess 231 of the insulating body 230 shown in FIG. 5A according to an embodiment of the present disclosure. Illustrations of the first electrodes 220, the electrophoretic liquid 251 and the reflective charged particles 252 are omitted for the convenience of illustration. As shown in FIG. 5C, in order to ensure that all of the incident light beyond a predetermined diffusion angle range (for example 30 degrees) can be reflected and corrected such that an angle of an emergent light is limited within the predetermined angle range, sizes of the recesses 231 are designed such that the second electrodes 240 formed on the recesses satisfy the following relation:

$$0°<\alpha\leq\theta \quad (1)$$

where α is an angle between a normal Z of the substrate 210 and a line L connecting a bottom end of a second electrode sidewall portion 241a of one 240a of two adjacent second electrodes 240a and 240b and a top end of a second electrode sidewall portion 241b, adjacent to the second electrode sidewall portion 241a, of the other 240b of the two adjacent second electrodes 240a and 240b, and θ is a preset maximal angle between an emergent light R1 and the normal Z of the substrate 210.

For example, θ may be set to be 30 degrees according to requirements. In this way, when 0°<α≤30°, it can be ensured that all of a portion of an incident light R having an incident angle beyond 30 degrees can be reflected and corrected by the second electrode sidewall portions 241 in the peep preventing mode, so that the emergent light R1 is reflected in a perpendicular viewing direction, achieving a peep preventing effect. It should be understood by those skilled in the art that θ may be set to be a greater or smaller angle according to requirements.

In the case where the relation (1) is satisfied, a size of the recesses 231 and a distance between the recesses 231 may be set in combination with specific technology conditions. According to a specific example, the base angle β of the isosceles triangular section may be selected to be generally between 60° and 90° (i.e. greater than or equal to 60° and less than 90°), and the height H of the isosceles triangular section may be set to be about 10 μm, and the distance P1 between the top ends of the recesses 231 (the isosceles triangular sections) may be set to be about 8.5 μm. A length W of the lower side of the isosceles triangular section may be designed to be equal to the distance P1 between the top ends of the recesses 231 (the isosceles triangular sections).

The other aspects of the present embodiment are the same as those of the embodiment shown in FIGS. 1A-1E, and are no longer described herein for the sake of brevity.

Figure 6:
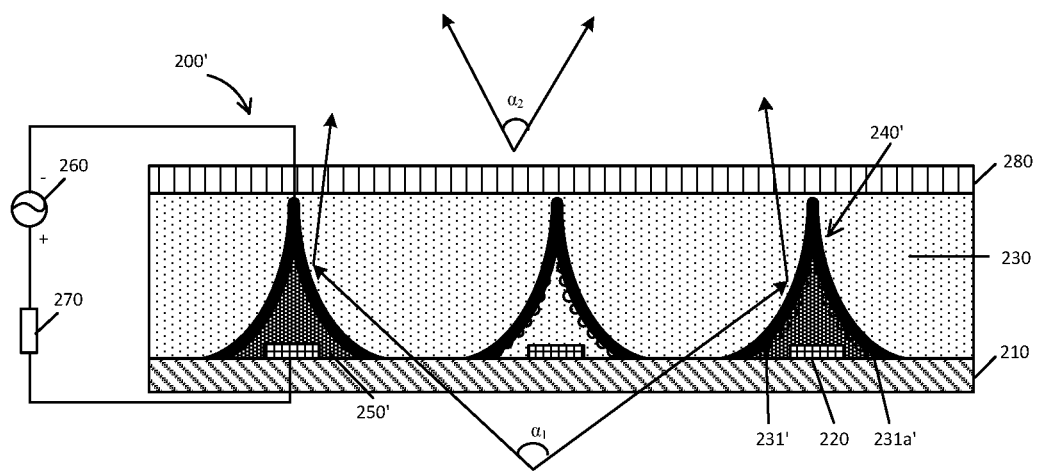
FIG. 6 is a schematic sectional view showing an embodiment of a modification to the peep preventing device shown in FIGS. 5A-5C.

FIG. 6 shows a peep preventing device 200' according to an embodiment of a modification to the embodiment shown in FIGS. 5A-5C. The present embodiment is different from the embodiment shown in FIGS. 5A-5C in that each of recesses 231' has an irregular isosceles triangular section. Specifically, each of two sidewalls 231a' of the recess 231' has a shape of a concave arc surface depressed towards an inside of the recess. Accordingly, each of closed spaces 250' defined by the substrate 210 and second electrodes 240' formed on the recesses 231' has an irregular isosceles triangular section. The peep preventing device according to the present embodiment can also achieve a peep preventing function, and can better increase the luminance at the perpendicular viewing angle in the peep preventing mode. The other aspects of the present embodiment are the same as those of the embodiment shown in FIGS. 5A-5C, and are no longer described herein for the sake of brevity.

Embodiments of another aspect of the present disclosure provide a display apparatus including the peep preventing device according to any one of the above embodiments. The display apparatus may include products or parts having display function such as a display panel, a monitor, a notebook computer, a tablet computer, a mobile phone, a digital frame, a personal digital assistant, and navigator.

Figure 7:
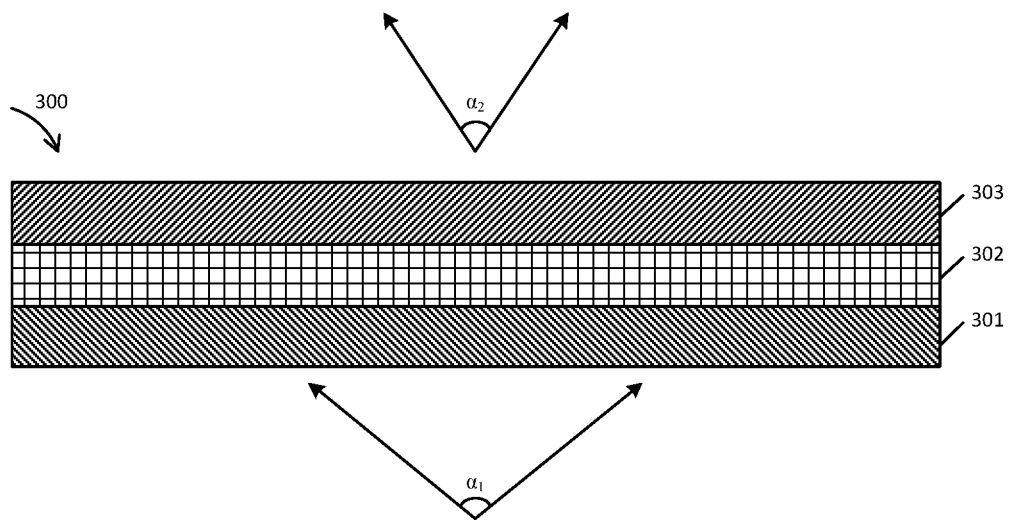
FIG. 7 is a schematic view showing a structure of a display apparatus according to an embodiment of the present disclosure.

FIG. 7 is a schematic view showing a structure of a display apparatus 300 according to an exemplary embodiment of the present disclosure. As shown in FIG. 7, the display apparatus 300 is a liquid crystal display apparatus including a backlight unit 301, the peep preventing device 302, and a liquid crystal display panel 303. The peep preventing device 302 is disposed between the backlight unit 301 and the liquid crystal display panel 303. Specifically, the backlight unit 301, the peep preventing device 302, and the liquid crystal display panel 303 may be bonded together through an optical transparent adhesive.

According to the embodiment of the display apparatus, in the peep preventing mode, after a light emitted from the backlight unit 301 and having a wide viewing angle α1 is converged through the peep preventing device, the light emerges from a light emergence side of the liquid crystal display panel with a narrow viewing angle a2, thereby achieving a peed preventing effect. In addition to the peep prevention, the luminance at the perpendicular viewing angle is increased. In the case where the peep preventing device 302 is provided with a switching device, a free switch between the peep preventing mode and the non-peep preventing mode can also be achieved, thereby meeting usage needs of a user in different usage conditions.

Figure 8:
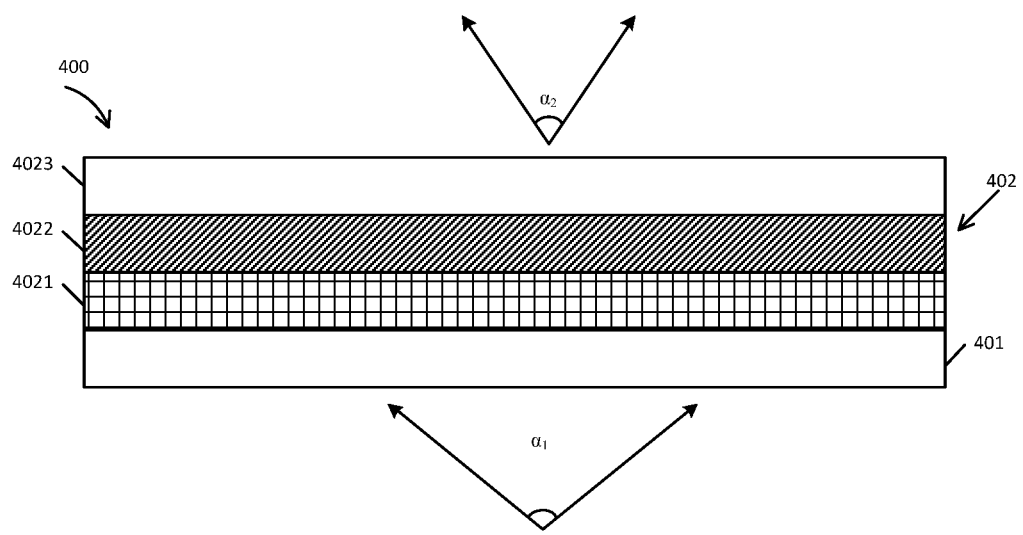
FIG. 8 is a schematic view showing a structure of a display apparatus according to another embodiment of the present disclosure.

FIG. 8 is a schematic view showing a structure of a display apparatus 400 according to an exemplary embodiment of the present disclosure. As shown in FIG. 8, the display apparatus 400 is a liquid crystal display apparatus including a backlight unit 401 and a liquid crystal display panel 402. The peep preventing device 4022 is integrated in the liquid crystal display panel 402. Specifically, the peep preventing device 4022 may be located between an array substrate 4021 and a color filter substrate 4023 of the liquid crystal display panel 402.

As another embodiment, the peep preventing device 4022 may be integrated in the array substrate 4021. For example, the peep preventing device shown in FIG. 1A may be first manufactured, then elements of the array substrate 4021 such as pixel structures are continuously manufactured on the peep preventing device with the peep preventing device as a substrate, and after that, the array substrate 4021 and the color filter substrate 4023 are assembled together.

According to the above embodiments of the display apparatus, in the peep preventing mode, after a light emitted from the backlight unit 401 and having a wide viewing angle a1 is converged through the peep preventing device 4022, the light emerges from the light emergence side of the liquid crystal display panel with the narrow viewing angle a2, thereby achieving the peed preventing effect. In addition to achievement of the peep prevention, the luminance at the perpendicular viewing angle is increased. In the case where the peep preventing device 4022 is provided with a switching device, a free switch between the peep preventing mode and the non-peep preventing mode can also be achieved, thereby meeting usage needs of a user in different usage conditions.

Figure 9:
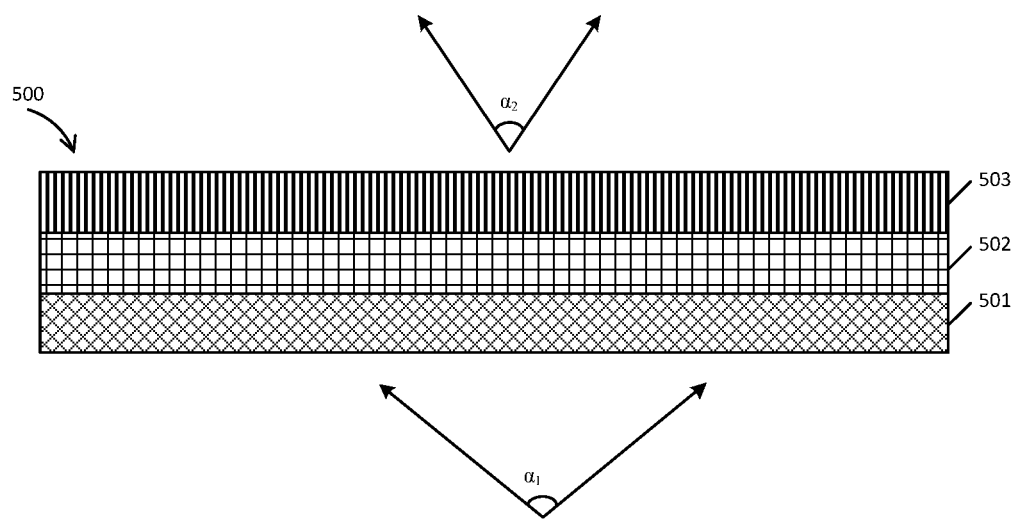
FIG. 9 is a schematic view showing a structure of a display apparatus according to still another embodiment of the present disclosure.

FIG. 9 is a schematic view showing a structure of a display apparatus 500 according to another exemplary embodiment of the present disclosure. As shown in FIG. 9, the display apparatus 500 is an organic light-emitting diode display apparatus including a white light organic light-emitting diode display substrate 501, the peep preventing device 502, and a color filter substrate 503. The peep preventing device 502 is disposed between the display substrate 501 and the color filter substrate 503. As another embodiment, the peep preventing device 502 may be integrated in the display substrate 501.

According to the embodiment of the display apparatus, in the peep preventing mode, after a light emitted from the display substrate 501 and having a wide viewing angle a1 is converged through the peep preventing device 502, the light emerges from a light emergence side of the organic light-emitting diode display panel with a narrow viewing angle a2, thereby achieving a peed preventing effect. In addition to achievement of the peep prevention, the luminance at the perpendicular viewing angle is increased. In the case where the peep preventing device 502 is provided with a switching device, a free switch between the peep preventing mode and the non-peep preventing mode can also be achieved, thereby meeting usage needs of a user in different usage conditions.

As another embodiment, the peep preventing device 502 may applied to an organic light-emitting diode display apparatus without the color filter substrate 503. In this case, the white light organic light-emitting diode display substrate 501 is replaced with a color organic light-emitting diode display substrate.

With the display apparatus according to the above embodiments, in fact a position of the peep preventing device is not limited as long as the peep preventing device is disposed on the light incidence side of the color filter substrate. In addition, with the display apparatus according to the above embodiments, since the peep preventing device is integrated in the display apparatus, it can be carried and used together with the display apparatus, thereby improving convenience of the user, compared with a case where a peep preventing film needs to be carried separately.

The above embodiments are merely exemplary description of the principles and configurations of the present disclosure, and are not intended to limit the present disclosure. Those skilled in the art should understand that any changes and improvements to the present disclosure may be made without departing from the general inventive concept of the present disclosure. The changes and improvements are within the scope of this disclosure. The protection scope of the present disclosure should be defined by the scope of the claims of the present application.

What is claimed is:

1. A peep preventing device comprising:
   a transparent substrate;
   a plurality of first electrodes on the transparent substrate;
   a transparent insulating body on the transparent substrate, wherein the insulating body has a plurality of recesses in one-to-one correspondence with the first electrodes, each of the recesses has an opening facing towards the transparent substrate, the first electrodes are located in the recesses, respectively, and an area of a section, taken along a plane parallel to the transparent substrate, of each of the recesses gradually reduces in a direction away from the transparent substrate;
   a plurality of transparent second electrodes each of which comprises a second electrode sidewall portion covering a sidewall of one of the recesses, the plurality of transparent second electrodes being in one-to-one correspondence with the plurality of recesses; and
   electrophoretic liquids contained respectively in closed spaces defined by the insulating body, the second electrodes and the transparent substrate, wherein the electrophoretic liquids contain reflective charged particles adapted to adhere to the second electrodes when a first electric field is applied between the first electrodes and the second electrodes.

2. The peep preventing device of claim 1, further comprising:
   a switching device electrically connected with the first electrodes and the second electrodes, wherein the switching device is configured such that, when the switching device is in a first operating state, the first electric field is applied between the first electrodes and the second electrodes so that the reflective charged particles adhere to the second electrodes; and when the switching device is in a second operating state, a second electric field opposite in direction to the first electric field is applied between the first electrodes and the second electrodes so that the reflective charged particles adhere to the first electrodes.

3. The peep preventing device of claim 1, wherein:
each of the recesses has two sidewalls each having a plane.

4. The peep preventing device of claim 3, wherein:
the following relation is satisfied by an angle α between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes:
0°<α≤θ, where θ is a preset maximal angle between an emergent light and the normal of the transparent substrate.

5. The peep preventing device of claim 4, wherein:
a value of θ is 30 degrees.

6. The peep preventing device of claim 3, wherein:
each of the closed spaces defined between the second electrodes and the transparent substrate has an isosceles trapezoidal section along a plane perpendicular to the transparent substrate, and each of the second electrodes further comprises a second electrode connection portion connecting two second electrode sidewall portions at ends of the two second electrode sidewall portions facing away from the transparent substrate.

7. The peep preventing device of claim 3, wherein:
each of the closed spaces defined between the second electrodes and the transparent substrate has an isosceles triangular section along a plane perpendicular to the transparent substrate, and two second electrode sidewall portions of each of the second electrodes are directly connected together.

8. The peep preventing device of claim 6, wherein:
the isosceles trapezoidal section has a base angle that is greater than or equal to 60° and less than 90°.

9. The peep preventing device of claim 7, wherein: the isosceles triangular section has a base angle that is greater than or equal to 60° and less than 90°.

10. The peep preventing device of claim 1, wherein:
the sidewall of each of the recesses has a shape of a concave arc surface depressed towards an inside of the recess.

11. The peep preventing device of claim 10, wherein:
the following relation is satisfied by an angle α between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes:
0°<α≤θ, where θ is a preset maximal angle between an emergent light and the normal of the transparent substrate.

12. The peep preventing device of claim 1, wherein:
the section, taken along the plane parallel to the transparent substrate, of each of the recesses has an elliptical shape or a polygonal shape.

13. A display apparatus comprising the peep preventing device of claim 1.

14. The display apparatus of claim 13, further comprising:
a color filter substrate, wherein the peep preventing device is disposed on a light incidence side of the color filter substrate.

15. The display apparatus of claim 13, further comprising:
a liquid crystal display panel and a backlight unit, wherein the peep preventing device is disposed between the liquid crystal display panel and the backlight unit.

16. The display apparatus of claim 13, further comprising:
a liquid crystal display panel and a backlight unit, wherein the peep preventing device is integrated in the liquid crystal display panel, is located between an array substrate and a color filter substrate, or is integrated in the array substrate.

17. The display apparatus of claim 13, further comprising:
an organic light-emitting diode panel, wherein the peep preventing device is disposed in the organic light-emitting diode panel.

18. A method of manufacturing a peep preventing device, the method comprising:
providing a support substrate;
forming a layer of a transparent insulating body on the support substrate;
forming a plurality of recesses in the transparent insulating body, wherein each of the recesses comprises two sidewalls inclined away from each other in a direction away from the support substrate;
forming a plurality of transparent second electrodes along the recesses of the transparent insulating body, wherein each of the second electrodes comprises a second electrode sidewall portion covering a sidewall of a corresponding one of the recesses, and the plurality of transparent second electrodes are in one-to-one correspondence with the plurality of recesses;
injecting electrophoretic liquids in the recesses formed with the second electrodes; and
covering the transparent insulating body with a transparent substrate to define closed spaces between the insulating body and the second electrodes and the transparent substrate so that the electrophoretic liquids are encapsulated in the closed spaces, wherein a plurality of first electrodes are formed on the transparent substrate, and each of the first electrodes is located in a corresponding one of the recesses and is spaced from two sidewalls of the corresponding one of the recesses,
wherein the electrophoretic liquids contain reflective charged particles, and the reflective charged particles are adapted such that, when a first electric field is applied between the first electrodes and the second electrodes, the reflective charged particles adhere to the second electrodes, thereby forming a peep preventing mode; and when a second electric field opposite in polarity to the first electric field is applied between the first electrodes and the second electrodes, the reflective charged particles adhere to the first electrodes, thereby forming a non-peep preventing mode.

19. The method of claim 18, wherein:
the following relation is satisfied by an angle α between a normal of the transparent substrate and a line connecting a bottom end of a second electrode sidewall portion of one of two adjacent ones of the second electrodes and a top end of a second electrode sidewall portion, adjacent to the second electrode sidewall portion of the one second electrode, of the other of the two adjacent ones of the second electrodes:
0°<α≤θ, where θ is a preset maximal angle between an emergent light and the normal of the transparent substrate.

20. The method of claim 18, further comprising:
stripping the support substrate after covering the transparent insulating body with the transparent substrate.

* * * * *